US008884396B2

(12) United States Patent
Endo

(10) Patent No.: US 8,884,396 B2
(45) Date of Patent: Nov. 11, 2014

(54) SEMICONDUCTOR DEVICE AND MANUFACTURING METHOD THEREOF

(75) Inventor: Mitsuyoshi Endo, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 23 days.

(21) Appl. No.: 13/238,705

(22) Filed: Sep. 21, 2011

(65) Prior Publication Data

US 2012/0248579 A1    Oct. 4, 2012

(30) Foreign Application Priority Data

Apr. 4, 2011 (JP) ................................. 2011-082951

(51) Int. Cl.
*H01L 23/52* (2006.01)
*H01L 21/768* (2006.01)
(Continued)

(52) U.S. Cl.
CPC ... *H01L 25/0657* (2013.01); *H01L 2221/68372* (2013.01); *H01L 2224/92132* (2013.01); *H01L 2225/06513* (2013.01); *H01L 24/06* (2013.01);
(Continued)

(58) Field of Classification Search
USPC ................................. 257/210–211, 503, 508,
257/E33.062–E33.066, E31.124–E31.126,
257/E51.019, 620–665, 734–786,
257/E29.111–E29.165, E23.01–E23.079,
257/E23.141–E23.179
See application file for complete search history.

(56) References Cited

U.S. PATENT DOCUMENTS

2009/0014891 A1*  1/2009  Chang et al. .................. 257/777
2010/0171223 A1   7/2010  Kuo et al.
(Continued)

FOREIGN PATENT DOCUMENTS

JP    2010-157741    7/2010
JP    2010-212297    9/2010
(Continued)

OTHER PUBLICATIONS

Title : 3D stacked Chip Technology Using Bottom-up Electroplated TSVs Authors: H.H. Chang, Y.C. Shih, Z.C. Hsiao, C.W. Chiang, Y.H. Chen and K.N. Chiang Date: May 26-29, 2009 Electronic Components and Technology Conference, 2009. ECTC 2009. 59th; pp. 1177-1184.*
(Continued)

*Primary Examiner* — Kyoung Lee
*Assistant Examiner* — Ratisha Mehta
(74) *Attorney, Agent, or Firm* — White & Case LLP

(57) ABSTRACT

According to one embodiment, a first back surface of a first substrate and a second front surface of a second substrate are jointed together so as to connect a first conductor with a second conductor. The first conductor includes a portion having a diameter equal to that of a first gap formed above a first metal layer in a range between the first metal layer and a first front surface, and a portion having a diameter greater than that of the first gap and smaller than an outer diameter of the first metal layer in a range between the first metal layer and the first back surface. A first insulating layer has a gap formed above the first metal layer, the gap being greater than the first gap and smaller than the outer diameter of the first metal layer.

8 Claims, 11 Drawing Sheets

(51) Int. Cl.
*H01L 25/065* (2006.01)
*H01L 21/683* (2006.01)
*H01L 21/66* (2006.01)
*H01L 25/00* (2006.01)
*H01L 23/00* (2006.01)

(52) U.S. Cl.
CPC ...... *H01L 24/24* (2013.01); *H01L 2224/05571* (2013.01); *H01L 2225/06544* (2013.01); *H01L 24/83* (2013.01); *H01L 21/76898* (2013.01); *H01L 24/82* (2013.01); *H01L 2224/83005* (2013.01); *H01L 2224/9202* (2013.01); *H01L 2224/24146* (2013.01); *H01L 2224/16146* (2013.01); *H01L 21/6836* (2013.01); *H01L 2224/82031* (2013.01); *H01L 2224/0557* (2013.01); *H01L 22/22* (2013.01); *H01L 2224/13025* (2013.01); *H01L 24/03* (2013.01); *H01L 24/05* (2013.01); *H01L 2224/32145* (2013.01); *H01L 2224/94* (2013.01); *H01L 2224/82005* (2013.01); *H01L 2224/03002* (2013.01); *H01L 24/92* (2013.01); *H01L 2224/05647* (2013.01); *H01L 25/50* (2013.01); *H01L 24/16* (2013.01)

USPC ........... 257/503; 257/210; 257/211; 257/508; 257/E33.064; 257/E33.065; 257/E51.019; 257/621; 257/E29.111

(56) References Cited

U.S. PATENT DOCUMENTS

| | | |
|---|---|---|
| 2010/0225000 A1 | 9/2010 | Sugizaki et al. |
| 2010/0225002 A1 | 9/2010 | Law et al. |
| 2012/0038029 A1 | 2/2012 | Endo |

FOREIGN PATENT DOCUMENTS

| | | |
|---|---|---|
| JP | 2010-219526 | 9/2010 |
| JP | 2010-225701 | 10/2010 |
| WO | 2006/080337 | 8/2006 |

OTHER PUBLICATIONS

Keast, et al. Three-Dimensional Integration Technology for Advanced Focal Planes, Mar. 2007.
Keast, et al. 3D Integration for Integrated Circuits and Advanced Focal Planes, 3D-System Integration Conference, Mar. 26-27, 2007 on pp. 3-4 to 3-16.

* cited by examiner

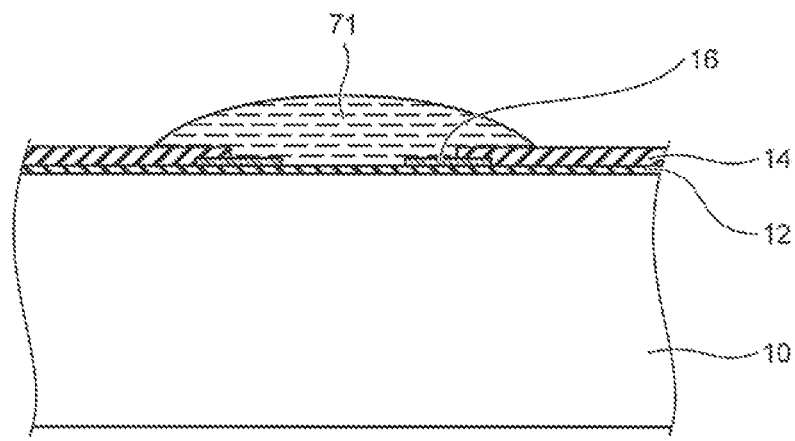
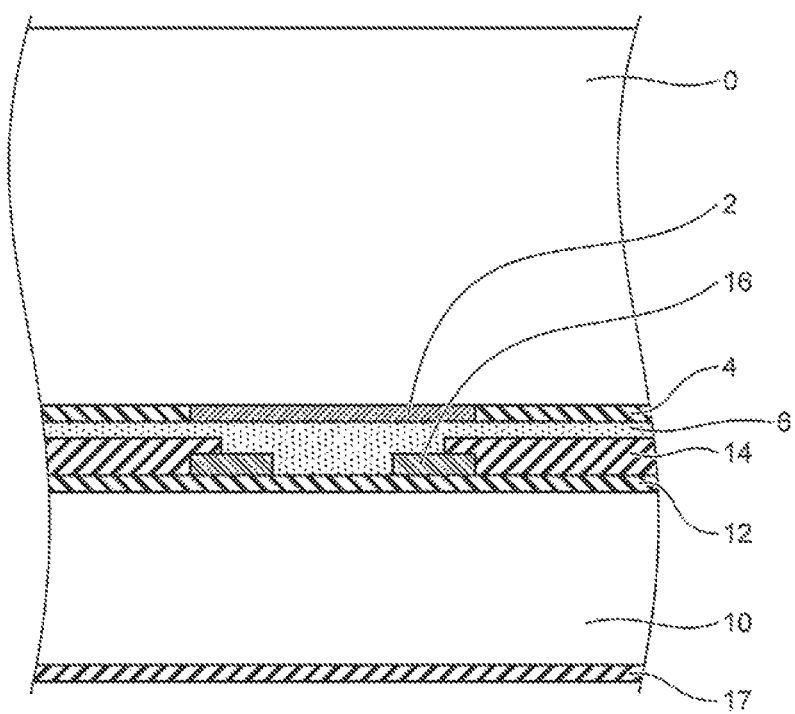

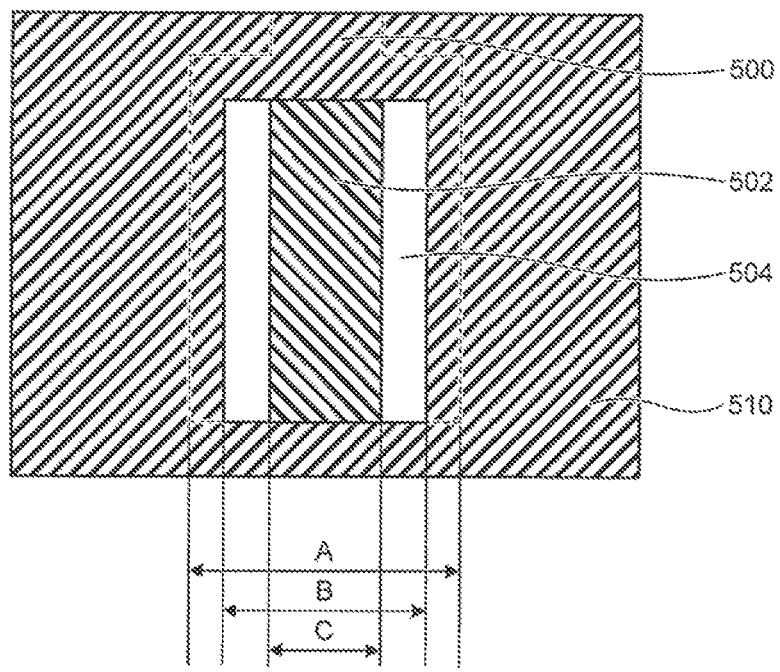

US 8,884,396 B2

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2011-82951, filed on Apr. 4, 2011; the entire contents of which are incorporated herein by reference.

FIELD

Embodiments described herein relate generally to a semiconductor device and a manufacturing method thereof.

BACKGROUND

Along with the recent demand for miniaturization of personal digital assistances, storage devices, and the like, there has been an increasing demand for mounting of a plurality of semiconductor chips with high density. Under such circumstances, a structure having a plurality of semiconductor chips stacked therein has been studied. For example, a semiconductor module is manufactured in such a manner that an operational test is performed on each semiconductor chip in the state of a semiconductor wafer so as to select non-defective chips, and the non-defective chips are stacked. Typically, each chip has a through via hole, connecting pads formed on the top surface of the chip, and connecting bumps formed on the bottom surface of the chip. The bumps formed on an upper chip are connected to the pads formed on a lower chip, thereby electrically connecting the upper and lower chips.

However, the use of bumps to connect semiconductor chips results in an increase in connection pitch. Additionally, it is necessary to ensure a certain thickness of each chip for handling the connection between bumps and pads. These circumstances hinder a reduction in the thickness of the semiconductor module. Furthermore, an increase in the number of stacked chips may cause deterioration in the throughput of the stacking process and in the connection yield.

On the other hand, there is another method of manufacturing a semiconductor module in which semiconductor wafers are joined together and are then divided into chips. In this method, bumps for providing electrical connection between wafers can be omitted. This results in solving the above-mentioned problems which may be caused when bumps are used.

When the method of dividing the joined semiconductor wafers into chips is employed, it is impossible to select only non-defective semiconductor chips to be stacked. Accordingly, the method requires a countermeasure for avoiding the situation in which a failure occurs in the entire semiconductor module when a defective semiconductor chip is present. The situation in which a failure occurs in the entire semiconductor module can be avoided in the following manner, for example. That is, a trimming region is formed in advance for each of wiring lines connected to a via land, and if a defective chip is found, a laser beam is applied to the trimming region to disconnect the corresponding wiring line.

However, an increase in the number of disconnected wiring lines leads to an increase in the trimming region. This may result in limitation of the degree of freedom of design and deterioration in the throughput. Additionally, other problems such as a cutting failure due to insufficient welding of wiring lines, a short-circuit failure due to scattering of a metal material of wiring lines, and a lack of cutting stability due to difficulty in controlling the shape of a cut portion may occur. Especially in the case of using a copper wiring line, the difficulty in welding and cutting increases, which makes these problems more significant.

To join semiconductor wafers together, an effective structure or manufacturing process for ensuring electrical connection between via holes that penetrate wafers and semiconductor elements formed on each wafer and for ensuring electrical connection with external parts has not been established yet.

BRIEF DESCRIPTION OF THE DRAWINGS

FIGS. 2 to 11 are sectional views schematically illustrating an exemplary process of the manufacturing method of a semiconductor device according to the first embodiment;

FIG. 13 is a schematic plan view of a semiconductor device including a via land having another shape.

DETAILED DESCRIPTION

In general, according to one embodiment, a first substrate includes a first semiconductor element provided above a first front surface of the first substrate; a first metal layer electrically connected to the first semiconductor element and having a first gap above the first front surface of the first substrate; and a first insulating layer formed above each of the first metal layer and the first front surface. The first substrate also includes a first conductor embedded in a first via hole at a forming position of the first metal layer, the first via hole penetrating the first substrate in a thickness direction thereof. A second substrate includes a second semiconductor element provided above a second front surface of the second substrate; and a second conductor embedded in a second via hole penetrating the second substrate in a thickness direction thereof. A first back surface opposed to the first front surface of the first substrate and the second front surface of the second substrate are joined together so as to connect the first conductor with the second conductor. The first conductor includes a first portion having a diameter equal to that of the first gap in a range between the first metal layer and the first front surface; and a second portion having a diameter greater than that of the first gap and smaller than an outer diameter of the first metal layer in a range between the first metal layer and the first back surface. The first insulating layer has a gap formed above the first metal layer, the gap being greater than the first gap and smaller than the outer diameter of the first metal layer.

Exemplary embodiments of a semiconductor device and a manufacturing method thereof will be explained below in detail with reference to the accompanying drawings. The present invention is not limited to the following embodiments.

First Embodiment

Figure 1:
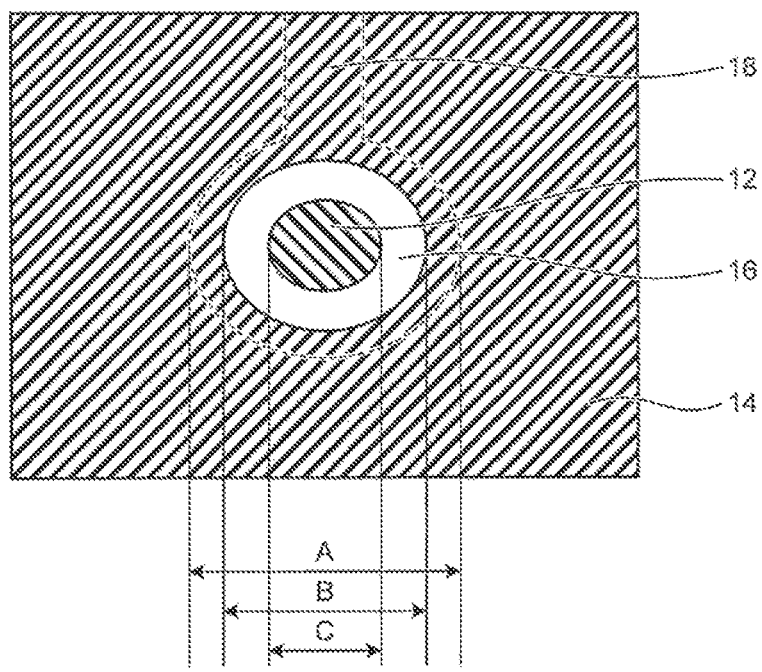
FIG. 1 is a schematic plan view illustrating a configuration in the vicinity of a via land according to an embodiment.
Figure 2:
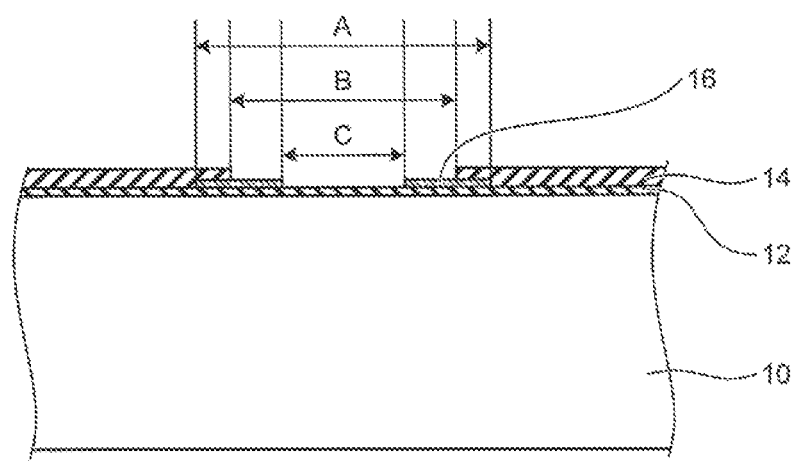

A semiconductor device and a manufacturing method thereof according to a first embodiment will be described with reference to the drawings. FIG. 1 is a schematic plan view of a via land according to the first embodiment. FIGS. 2 to 11 are sectional views each schematically illustrating an exemplary process of the manufacturing method of a semiconductor device according to the first embodiment. As illustrated in FIG. 2, insulating layers 12 and 14 are formed on a semiconductor wafer 10, and a via land 16 made of metal (for example, copper) is formed on the insulating layer 12. The via land 16 has a doughnut shape in plan view (in a direction perpendicular to the principal surface of the semiconductor wafer 10), and the insulating layer 12 formed below the via land 16 is exposed at a central portion. The via land 16 is connected to a metal wiring line (hereinafter referred to as "wiring line") 18 at an end portion. The wiring line 18 is connected to a semiconductor element not illustrated (for example, a semiconductor memory such as a flash memory or a DRAM (Dynamic Random Access Memory)). As illustrated in FIG. 1, the insulating layer 14 is formed in a region at a predetermined distance or further from the center of the land so that a portion (a portion in the range from the land center to the predetermined distance) of the via land 16 is exposed. Herein, A represents the outer diameter of the via land 16; B represents the outer diameter of a portion of the via land 16 which is not, covered by the insulating layer 14 (an opening diameter of the insulating layer 14); and C represents the inner diameter of the via land 16 (diameter excluding the via land). In the structure as described above, the relation of A>B>C is maintained. For example, A is 20 μm; B is 14 μm; and C is 7 μm.

A plurality of chips (for example, about more than 700 chips for a wafer of 300 mm) is formed on the semiconductor wafer 10, and each chip has the structure of the via land 16 as illustrated in FIGS. 1 and 2. In the state of the semiconductor wafer 10, an operational test is performed on each chip with a test device such as a probe card. Thus, defective semiconductor chips are specified, which makes it possible to create drawing data, which is called a wafer map, representing the positions of the defective chips on the semiconductor wafer 10.

Next, as illustrated in FIG. 3, an etchant 71 is applied onto the via land 16 of a defective chip. As a result, the exposed portion of the via land 16 is removed. In the manner as described above, the semiconductor wafer 10 in which a part of the via land of each defective chip is removed can be obtained.

Then, the semiconductor wafer 10 is stacked with a second wafer 0 serving as a base substrate. The semiconductor wafer 0 has a number of connecting pads 2 corresponding to the number of the via lands 16. The semiconductor wafer 0 and the semiconductor wafer 10 are joined together in the state where the connecting pads 2 of the semiconductor wafer 0 are aligned so as to be positioned immediately above the via land 16 which is provided on each chip of the semiconductor wafer 10. In the first embodiment, an adhesive layer 6 is used to join the semiconductor wafers 0 and 10 together. Alternatively, the semiconductor wafers 0 and 10 may be directly joined together without using the adhesive layer 6. More alternatively, a layer such as an insulating layer may be formed on either one or both of the semiconductor wafer 0 and the semiconductor wafer 10, and the semiconductor wafers 0 and 10 may be joined together through the insulating layer or the like. For example, an insulating layer for covering the insulating layer 14 and the via land 16 may be further formed. At this time, the combined thickness of the wafer 0 and the wafer 10 is 775 μm, for example.

After that, in the state where the semiconductor wafer 0 is held, the back surface of the semiconductor wafer 10 is ground and polished to a thickness of 20 μm. At this time, since the semiconductor wafer 10 is joined with the semiconductor wafer 0, the rigidity to withstand the polishing can be ensured. After the polishing, an insulating layer 17 is formed on the back surface (polished surface) of the semiconductor wafer 10 as illustrated in FIG. 4.

A resist pattern (not illustrated) is formed on the back surface using a well-known technique and dry etching is then performed, thereby forming a via hole 15. The cross-section of the via hole 15 taken along the direction in parallel with the principal surface of the semiconductor wafer 10 has a substantially circular shape in the first embodiment. The center of the cross-section substantially coincides with the center of the via land 16 in plan view, and an inner diameter D (for example, 10 μm) of the cross-section satisfies the relation of A>D>C (A represents the outer diameter of the via land 16; C represents the inner diameter (diameter excluding the via land) of the via land 16; and D represents the inner diameter of the via hole 15). Accordingly, during the etching process for forming the via hole 15 penetrating the wafer 10, the via land 16 serves as a mask for inhibiting etching after a portion in the range from the back surface to the via land 16 of the wafer (including the insulating layers 17 and 12) is etched. Etching is continuously carried out through a gap portion of the via land 16 which is not blocked by the via land 16. Etching is continued until the adhesive layer 6 is etched to reach the electrode pads 2 of the semiconductor wafer 0.

Figure 5:
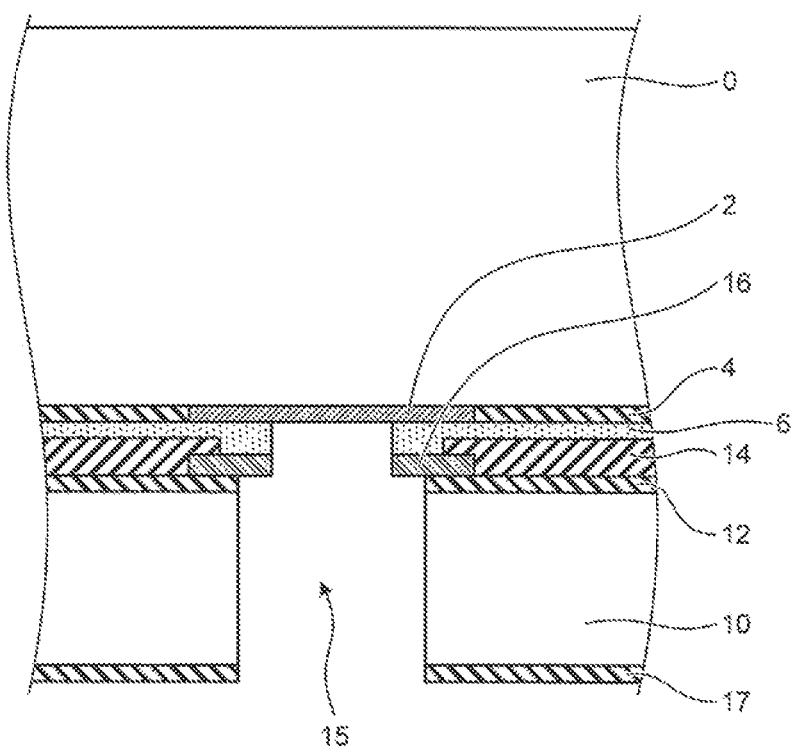

The via hole 15 thus formed has steps formed at positions corresponding to the via lands 16 as illustrated in FIG. 5. This results in formation of two regions: a large diameter region ranging from the back surface of the semiconductor wafer 10 to the via land 16; and a small diameter region ranging from the via land 16 to the electrode pad 2 of the semiconductor wafer 0. In this case, the surface, which faces the back surface of the semiconductor wafer 10, of each of a part of the electrode pad 2 and a part of the via land 16 is exposed. If etching is performed such that the side surfaces of the via hole 15 are substantially perpendicular to the semiconductor wafer 10, the exposed portion of the electrode pad 2 has a diameter of about 7 μm and the exposed portion of the via land 16 has a diameter of about 10 μm (in this case, however, the via land 16 has a doughnut shape with an inner diameter of about 7 μm). Accordingly, the exposed area of the electrode pad 2 is substantially equal to the exposed area of the via land 16.

Figure 6:
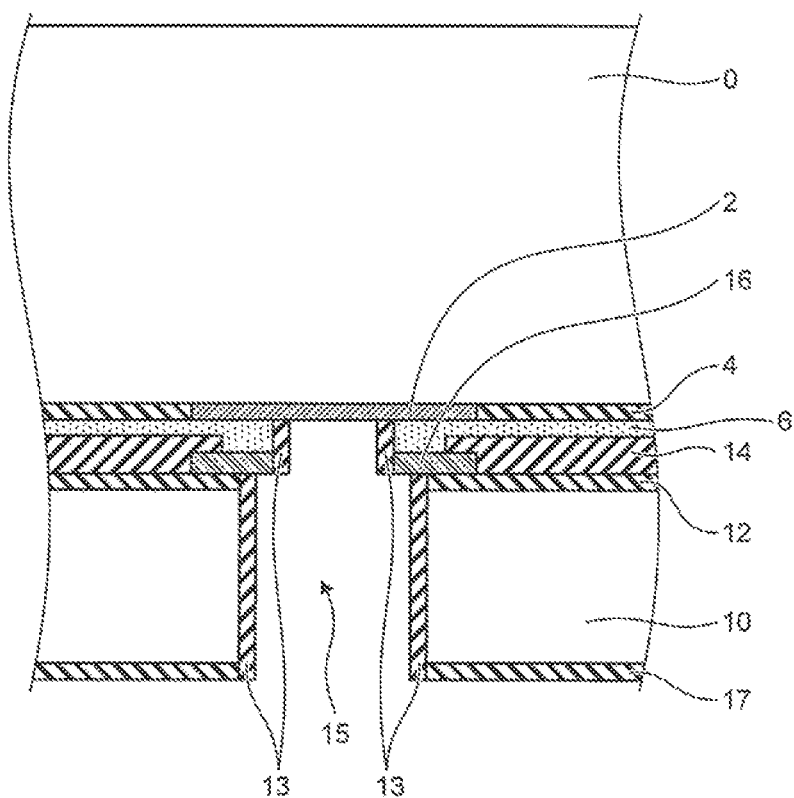

After that, an insulating film 13 is formed on the inner wall of the via hole 15. Then, as illustrated in FIG. 6, the insulation film 13 formed on the surface facing the back surface of the semiconductor wafer 10 is removed by RIE (Reactive Ion Etching), so that the insulating film 13 remains only on the side walls of the via hole 15.

Figure 7:
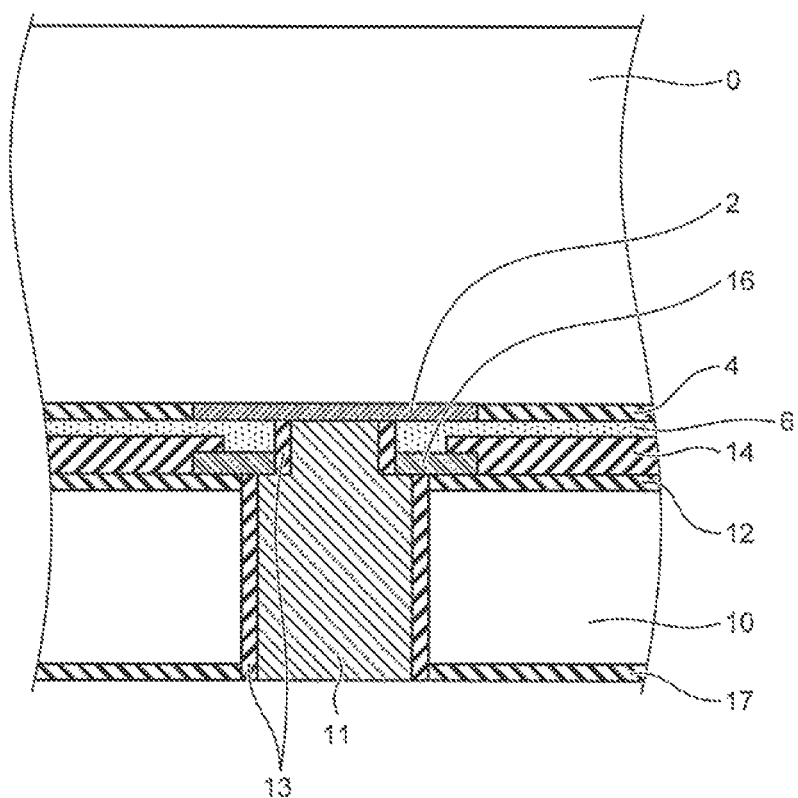

Further, a plating seed layer is formed within the via hole 15, as needed, and copper plating is carried out using the semiconductor wafer 0 as a plating electrode. As illustrated in FIG. 7, a metal 11 (for example, copper) is filled in the via hole 15. Because the via hole 15 is formed in each chip region, the plating is performed in the state where the plurality of via holes 15 is electrically connected in parallel to the semiconductor wafer 0. The use of the semiconductor wafer 0 as an electrode enables bottom-up filling, reduction of a void failure, and improvement in uniformity of the plating between the via holes 15 in the semiconductor wafer 10. Additionally, even if the via holes have a high aspect ratio, the filling property can be improved.

As a result, the surface of the via land 16 which faces the back surface side of the semiconductor wafer 10 is electrically connected to the metal 11 formed in the via hole 15. At the same time, the surface of the electrode pad 2 which faces the back surface side of the wafer 10 is electrically connected to the metal 11 formed in the via hole 15. Further, the exposed area of the via land 16 is substantially equal to the exposed area of the electrode pad 2, which makes it possible to satisfactorily maintain the electrical connection between the exposed portions and the metal 11 formed in the via hole.

Figure 8:
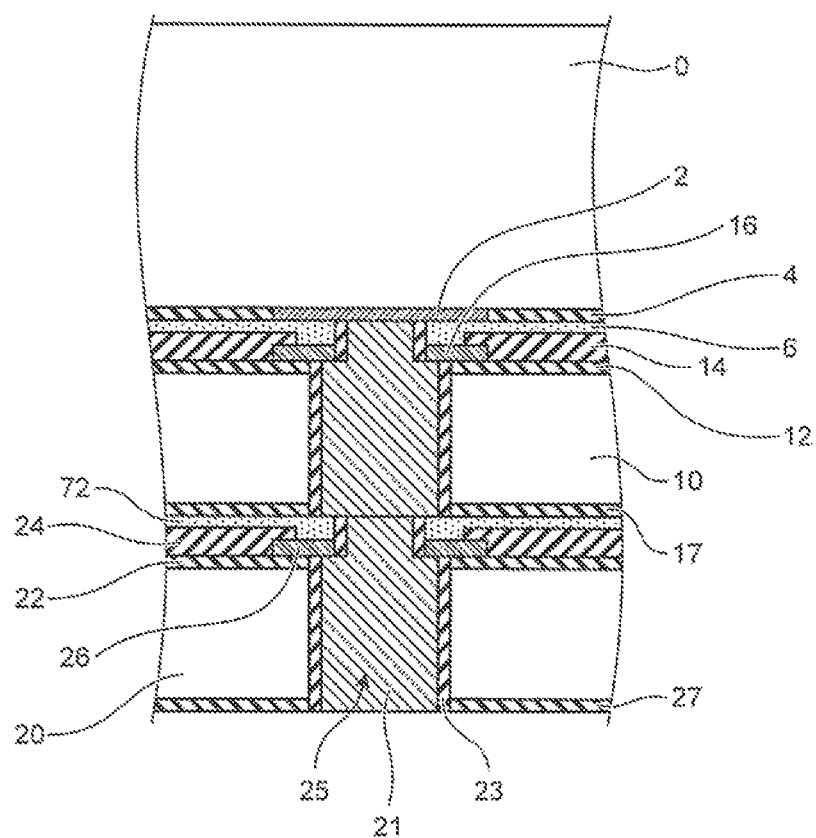

After that, the same processes are repeated. Specifically, a semiconductor element and a via land 26 are formed on each chip region of another semiconductor wafer 20, and a failure test is then performed. As illustrated in FIG. 3, a predetermined wiring line is removed in each defective chip. After that, as illustrated in FIG. 8, the element surface of the semiconductor wafer 20 and the back surface (polished surface) of the semiconductor wafer 10 are joined together using an adhesive layer 72. Then, the back surface of the semiconductor wafer 20 is polished to thereby thin the semiconductor wafer 20 to a thickness of 20 μm. An insulating film 23 is formed on the polished surface, and etching is then performed on the back surface of the semiconductor wafer 20 to thereby form a via hole 25. The via hole 25 has a diameter greater than that of the gap of the via land 26, and the via hole 25 is formed such that the center of the via hole 25 substantially coincides with the center of the via land 26 in plan view. Thus, the via hole 25 has a large diameter portion ranging from the back surface of the semiconductor wafer 20 to the via land 26, and a small diameter portion ranging from the via land 26 to the metal 11 formed in the via hole 15. During the etching process, the back surface of the semiconductor wafer 10 and the front surface of the semiconductor wafer 20 are joined together through the adhesive layer 72. Accordingly, not only the semiconductor wafer 20 but also the adhesive layer 72 is etched to expose the metal 11 of the semiconductor wafer 10. In the manner as described above, the via hole 25 penetrating the semiconductor wafer 20 is formed. After formation of the insulating film 23 on the side walls, a metal 21 is filled in the via hole 25 using the semiconductor wafer 0 as a plating electrode (FIG. 8).

Figure 9:
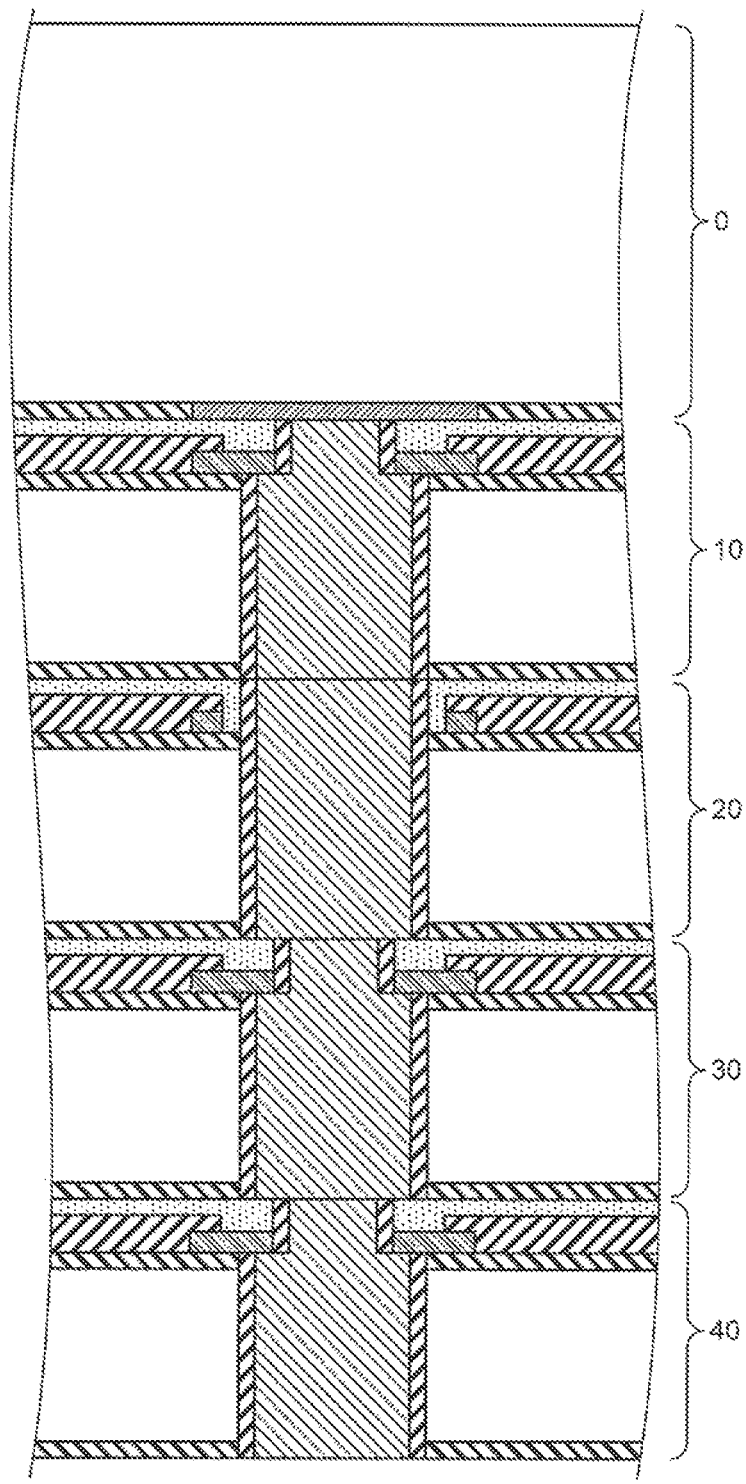

FIG. 9 illustrates a structure in which semiconductor wafers 0, 10, 20, 30, 40 are stacked (components of the structure are illustrated in other figures, so reference numerals and explanation thereof are omitted). In this case, however, it has turned out as a result of a test that the semiconductor wafer 20 includes defective chips at illustrated positions. For this reason, a part of the via land is removed using an etchant in the manner as described above, and the other semiconductor wafers 10 and 30 are then stacked. This allows the process for the via hole to be finished without being inhibited by the via land, during formation of the via hole in the semiconductor wafer 20. As a result, the chip in the semiconductor wafer 20 and the conductor formed in the via hole are electrically disconnected.

Figure 10:
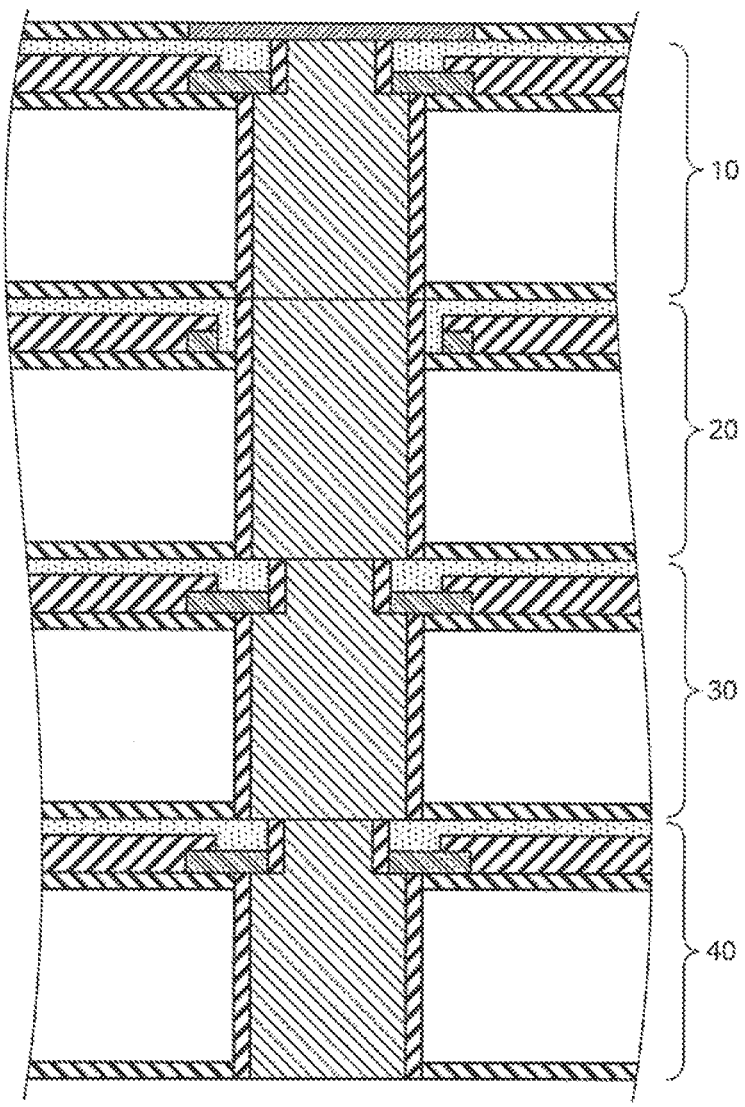

After that, as illustrated in FIG. 10, the front surface of the semiconductor wafer 0 is ground and polished to expose the connecting pads 2 (electrodes). The structure in which the semiconductor wafers 10 to 40 are stacked has a thickness of 80 μm. Accordingly, if the structure is held or clamped during the polishing of the semiconductor wafer 0, the semiconductor wafer 0 can be suitably polished. This makes it possible to manufacture a structure including a via hole penetrating the entire structure and conductor portions (connecting pads 2 and conductor exposed to the back surface of the semiconductor wafer 40) which are electrically connected to the via hole and exposed to the front and back surfaces of the structure.

After that, the stacked layer structure of the semiconductor wafer is divided into chips by a well-known technique such as dicing or scribing. As a result of polishing and removing an upper portion of the semiconductor wafer 0, the stacked layer structure has a thickness of 80 μm or more. This enables favorable division.

Figure 11:
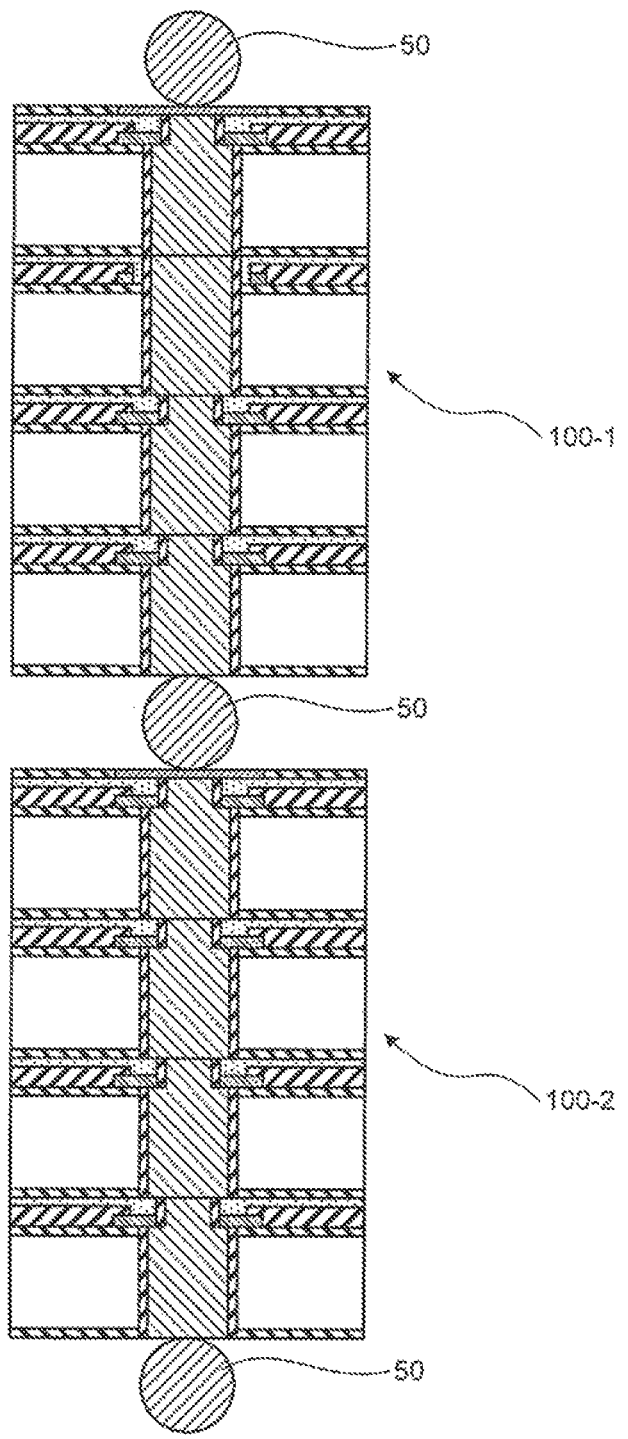

FIG. 11 illustrates a structure in which semiconductor modules 100-1 and 100-2 which are formed in the manner as described above are stacked through bumps 50. In the structure illustrated in FIG. 11, the two semiconductor modules 100-1 and 100-2 are each formed by stacking four semiconductor substrates. Alternatively, modules having different number of substrates to be stacked (for example, five layers or three layers) may be stacked. For example, when a semiconductor module having a 4-layer structure includes a defective semiconductor chip, the semiconductor module may be stacked with a semiconductor module having a 5-layer structure. On the other hand, when the semiconductor module having the 4-layer structure includes no defective semiconductor chip, the semiconductor module is further stacked with a semiconductor module having the 4-layer structure. Thus, the stack of semiconductor modules having different layer structures depending on the presence or absence of a defective chip enables adjustment of the entire memory capacity to be maintained constant.

Second Embodiment

Figure 12:
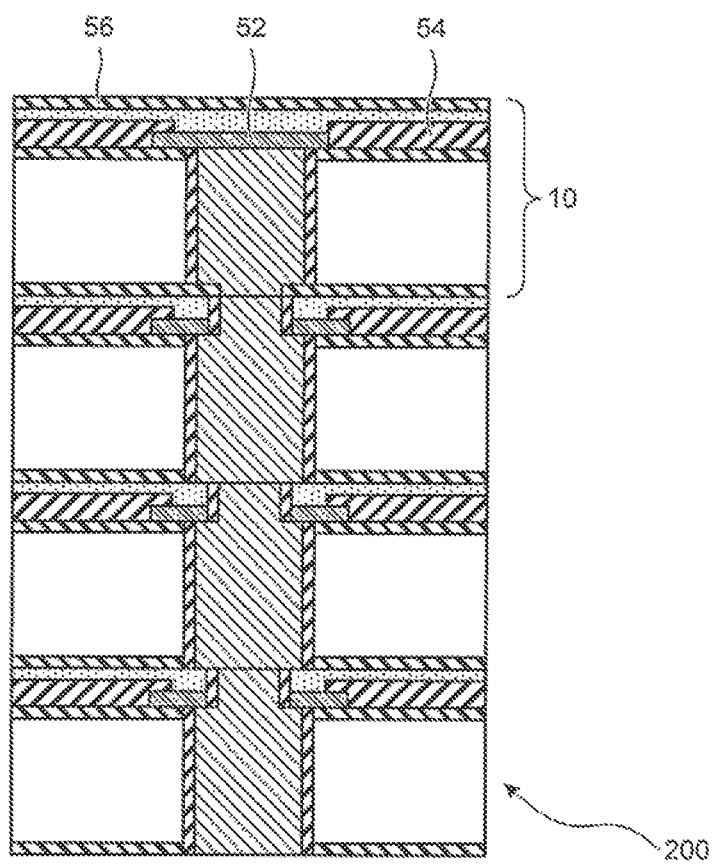
FIG. 12 is a schematic diagram illustrating a semiconductor module according to a second embodiment.

FIG. 12 is a schematic diagram of a semiconductor module according to a second embodiment. As for components fulfilling the same functions as those of the semiconductor module illustrated in the first embodiment, reference numerals and explanation thereof are omitted.

Generally, via holes (and conductor formed therein) are used for a signal line, a ground line, a power supply line, and the like. In some cases, there is no need to expose electrodes to the front surface of a semiconductor module, depending on the intended use. In this case, as illustrated in FIG. 12, a via land 52 in the semiconductor wafer 10 may have a structure with no gap. Insulating layers 54 and 56 are formed on the via land 52. In this case, the following process can be employed. That is, a transparent base substrate, such as glass, is prepared in place of the semiconductor wafer 0 and the base substrate and the front surface of the semiconductor wafer 10 are temporarily joined together using an adhesive layer, which makes it possible to polish the back surface of the semiconductor wafer 10. Then, as in the first embodiment, the plurality of joined semiconductor wafers is subjected to heat treatment and other treatments, and the entirety of the semiconductor wafer 10 and the base substrate is separated and removed. This leads to a reduction in cost of the semiconductor wafer 0. It is also possible to employ a structure in which an electrode to be electrically connected to a via hole is provided on the semiconductor wafer 10 and the electrode is exposed to the front surface after the base substrate is removed.

There has conventionally been known a method of establishing electrical conduction between substrates using a via hole upon stack of a SOI (Silicon-On-Insulator) substrate. Specifically, the front surface (element forming surface) of a wafer having a semiconductor element formed thereon and the front surface (element forming surface) of an SOI substrate having a semiconductor element formed thereon are joined together by oxide bonding. After that, the Si substrate formed on the back surface side of the SOI substrate is removed using an etchant to expose an $SiO_2$ film (BOX film). Thereafter, a via hole is formed to obtain electrical conduction between the both elements of the SOI substrate and the wafer and the via hole. However, this structure is based on the premise of using an expensive SOI substrate, resulting in limitation of the application range. Further, joining of the element forming surfaces may result in lowered joining yield. Furthermore, there has been disclosed no method of forming a via hole penetrating a module (a structure having a plurality of semiconductor wafers stacked therein). Unlike such a conventional technique, the above embodiments are not limited to an SOI substrate and thus are widely applicable. Furthermore, in the above embodiments, the element forming surfaces are not joined together, thereby preventing the joining yield from being lowered. Moreover, each via hole is formed at the predetermined position after the wafers are joined together. This provides an advantage of easily forming the via hole penetrating the stacked structure even in the case where a large number of wafers are stacked.

Note that the present invention is not limited to the above embodiment, but can be modified in various manners. For example, the number of wafers to be stacked is not limited to four, but eight or more wafers may be stacked. An increase in the number of wafers to be stacked may facilitate handling for separation or removal of a wafer or a base substrate.

As the base substrate which is thereafter separated or removed from the wafer structure, various materials including a semiconductor wafer and a transparent substrate such as glass may be used. In the case of performing a heat treatment during the separation/removal process to be performed thereafter, however, it is necessary to select a material in consideration of thermal expansion/contraction. It should be noted that when glass or the like is used as the base substrate, it is difficult to use the base substrate as a plating electrode.

A method other than plating may be used to fill a conductor into a via hole. It is not necessary to fill the conductor in all the space within the via hole. For example, the conductor may be disposed conformally.

Further, it is sufficient that the relation of A (representing the outer diameter of the via land)>B (representing the outer diameter of a portion of the via land which is not covered by the upper insulating film)>C (representing the inner diameter of the via land) and the relation of A>D (representing the via hole diameter)>C are satisfied in a specific cross-section. Specifically, as for the magnitude relation between the gap and the diameter, it is sufficient that the magnitude relation between the gap of the metal layer in a certain cross-section (a surface perpendicular to the front surface of the substrate) and the diameter of the cross-section is ensured. It is not necessary to ensure the magnitude relation in any cross-section. For example, provided that the magnitude relation in a predetermined cross-section is ensured, the gap of the metal layer or the like in the vertical cross-section may be greater than the hole diameter.

FIG. 13 is a schematic plan view of a semiconductor device including a via land having another shape. As illustrated in FIG. 13, for example, a via land 504 has a U-shape (the outline of the via land 504 covered with an upper insulating layer 510 is indicated by the dotted line). Thus, in a cross-section parallel to the lateral direction of FIG. 13, the relation of A>B>C is maintained. Meanwhile, in a cross-section parallel to the longitudinal direction (vertical direction) of FIG. 13, the via lands 504 are not provided at predetermined intervals, which makes it impossible to define the relation among A, B, and C. In such a structure, however, if a via hole having a circular shape in cross-section and having the relation of B>D>C is formed at the center in FIG. 13, the via land functions as a mask during etching for formation of the via hole, thereby achieving an object of the present invention. From the same point of view, it is understood that even in the case where wiring lines formed in parallel with each other at predetermined intervals are used in place of the via land, for example, the same function as the via land of the second embodiment can be obtained.

More alternatively, the via hole may be formed so as to satisfy the relation A>D>B. Also in this case, electrical insulation between the via hole (conductor formed therein) and the via land is not established only by removing the exposed portion of the via land in a defective chip, but the via land functions as a mask during etching for formation of the via hole. The name "via land" is used in the embodiments because a via land is provided in the middle of a through via hole and is electrically connected to the conductor formed in the via hole. However, the same function can also be obtained by using wiring lines or other metal films.

When the cross-section of a via hole or the like has a circular shape, the filling property of the conductor can be improved. The shape of the cross-section of each via hole is not limited to a circular shape, but may be a rectangular shape or another shape. More alternatively, the cross-section may be tapered.

The process for forming the semiconductor element and the like may be carried out before the process for joining the wafer and the base substrate or after the joining process. The order of the other processes can be changed freely to the extent that can be reasonably recognized by those skilled in the art based on the scope of the present invention.

The front surface of each substrate includes the front surface and a region extending in the height and depth directions in the vicinity of the front surface. The formation of elements and the like on the front surface of each substrate includes formation of elements on the front surface and in a region in the vicinity of the front surface.

The joining of substrates includes indirect joining of substrates through an adhesive layer or the like. Furthermore, the case where holes are continuously formed indicates temporal continuity and includes the case of etching both holes at once within the same chamber (without inhibiting a change of an etchant component). Moreover, as for the electrical connection relation, there is no need to directly connect the components. The components may be indirectly connected to each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first substrate structure including:
   a first substrate;
   a first metal layer having a first gap above a first front surface of the first substrate;
   a first insulating layer formed above each of the first metal layer and the first front surface; and
   a first conductor embedded in a first via hole at a forming position of the first metal layer, the first via hole penetrating the first substrate in a thickness direction thereof, and
a second substrate structure including:
   a second substrate; and
   a second conductor embedded in a second via hole penetrating the second substrate in a thickness direction thereof,
   a second metal layer formed above the second front surface and having a second gap; and
   a second insulating layer formed above each of the second metal layer and the second front surface,
wherein a first back surface opposed to the first front surface of the first substrate structure and a second front surface of the second substrate structure are joined together so as to connect the first conductor with the second conductor, the first conductor includes a first portion disposed in the first gap, and a second portion which has a diameter greater than that of the first gap and smaller than an outer diameter of the first metal layer and is disposed in a range between a back surface of the first metal layer and the first back surface of the first substrate structure, a diameter of the first conductor changes discontinuously at a boundary between the first portion and the second portion, the first insulating layer has a gap formed above the first metal layer, the gap being greater than the first gap and smaller than the outer diameter of the first metal layer, the second portion is located in the first substrate, the second conductor includes a third portion disposed in the second gap, and a fourth portion which has a diameter greater than that of the second gap and smaller than an outer diameter of the second metal layer and is disposed in a range between the back surface of the second metal layer and a second back surface of the second substrate, the second back surface being opposed to the second front surface, a diameter of the second conductor changes discontinuously at a boundary between the third portion and the fourth portion, the second insulating layer has a gap formed above the second metal layer, the gap being greater than the second gap and smaller than the outer diameter of the second metal layer, and the fourth portion is located in the second substrate.

2. The semiconductor device according to claim 1, wherein the first substrate structure is thinned by polishing the first back surface and is then connected to the second substrate structure, and the second substrate structure is thinned by polishing the second back surface.

3. The semiconductor device according to claim 1, wherein the first and second substrate structures each have a thickness of 50 µm or less.

4. The semiconductor device according to claim 1, wherein the first substrate structure further includes an electrode formed above a forming position of the first conductor of the first front surface.

5. The semiconductor device according to claim 4, wherein a contact area between the electrode and the first portion of the first conductor is substantially equal to a contact area between the first metal layer and the second portion of the first conductor.

6. A semiconductor device comprising:
a first substrate structure including:
a first substrate;
a first metal layer having a first gap above a first front surface of the first substrate;
a first insulating layer formed above each of the first metal layer and the first front surface; and
a first conductor embedded in a first via hole at a forming position of the first metal layer, the first via hole penetrating the first substrate in a thickness direction thereof, and
a second substrate structure including:
a second substrate; and
a second conductor embedded in a second via hole penetrating the second substrate in a thickness direction thereof,
wherein a first back surface opposed to the first front surface of the first substrate structure and a second front surface of the second substrate structure are joined together so as to connect the first conductor with the second conductor,
the first conductor includes a first portion disposed in the first gap, and a second portion which has a diameter greater than that of the first gap and smaller than an outer diameter of the first metal layer and is disposed in a range between a back surface of the first metal layer and the first back surface of the first substrate structure, a diameter of the first conductor changes discontinuously at a boundary between the first portion and the second portion,
the first insulating layer has a gap formed above the first metal layer, the gap being greater than the first gap and smaller than the outer diameter of the first metal layer,
the second portion is located in the first substrate,
the first substrate structure further includes an electrode formed above a forming position of the first conductor of the first front surface, and
a contact area between the electrode and the first portion of the first conductor is substantially equal to a contact area between the first metal layer and the second portion of the first conductor.

7. The semiconductor device according to claim 6, wherein the first substrate structure is thinned by polishing the first back surface and is then connected to the second substrate structure, and the second substrate structure is thinned by polishing the second back surface.

8. The semiconductor device according to claim 6, wherein the first and second substrate structures each have a thickness of 50 µm or less.

* * * * *